United States Patent
Robinson et al.

(10) Patent No.: US 8,058,159 B2
(45) Date of Patent: Nov. 15, 2011

(54) METHOD OF MAKING LOW WORK FUNCTION COMPONENT

(75) Inventors: Vance Robinson, Niskayuna, NY (US); Stanton Earl Weaver, Northville, NY (US); Joseph Darryl Michael, Delmar, NY (US)

(73) Assignee: General Electric Company, Niskayuna, NY (US)

( * ) Notice: Subject to any disclaimer, the term of this patent is extended or adjusted under 35 U.S.C. 154(b) by 263 days.

(21) Appl. No.: 12/198,955

(22) Filed: Aug. 27, 2008

(65) Prior Publication Data

US 2010/0055885 A1 Mar. 4, 2010

(51) Int. Cl.
*H01L 21/22* (2006.01)
*H01L 21/38* (2006.01)

(52) U.S. Cl. ............... 438/558; 438/563; 257/E21.482; 257/E21.47; 257/E21.14

(58) Field of Classification Search .............. 438/558, 438/563, 20; 257/10, 798, E21.482, E21.47, 257/E21.317, E21.467, E21.14, E21.144, 257/E21.142, E21.145, E21.15, E21.148, 257/E21.149
See application file for complete search history.

(56) References Cited

U.S. PATENT DOCUMENTS

| | | | |
|---|---|---|---|
| 5,354,694 A * | 10/1994 | Field et al. ................ | 438/20 |
| 5,675,972 A | 10/1997 | Edelson | |
| 5,722,242 A | 3/1998 | Edelson | |
| 5,810,980 A | 9/1998 | Edelson | |
| 5,973,259 A | 10/1999 | Edelson | |
| 6,089,311 A | 7/2000 | Edelson | |
| 6,103,298 A | 8/2000 | Edelson et al. | |
| 6,110,766 A * | 8/2000 | Hong ........................ | 438/151 |
| 6,117,344 A | 9/2000 | Cox et al. | |
| 6,281,514 B1 | 8/2001 | Tavkhelidze | |
| 6,417,060 B2 * | 7/2002 | Tavkhelidze et al. ........ | 438/380 |
| 6,495,843 B1 | 12/2002 | Tavkelidze | |
| 6,531,703 B1 | 3/2003 | Tavkhelidze | |
| 6,563,256 B1 * | 5/2003 | Zavadil et al. .......... | 313/346 DC |
| 6,806,173 B1 * | 10/2004 | Spitz et al. .................. | 438/559 |
| 6,869,855 B1 | 3/2005 | Tavkhelidze et al. | |
| 7,074,498 B2 | 7/2006 | Tavkhelidze et al. | |
| 7,220,984 B2 | 5/2007 | Tavkhelidze et al. | |
| 7,282,428 B2 * | 10/2007 | Inada ............................ | 438/559 |
| 7,456,543 B2 * | 11/2008 | Makansi ....................... | 310/306 |
| 7,507,649 B2 * | 3/2009 | Werner et al. .................. | 438/567 |

(Continued)

FOREIGN PATENT DOCUMENTS

GB     1309423 A     3/1973

(Continued)

OTHER PUBLICATIONS

A. Villegas, et al "Work funciton change caused by alkali ion sputtering " Applied Surface Science 203-204 (2003) pp. 94-97.*

(Continued)

*Primary Examiner* — Caridad Everhart
(74) *Attorney, Agent, or Firm* — Richard D. Emery (57) ABSTRACT

A method for fabricating a component is disclosed. The method includes: providing a member having an effective work function of an initial value, disposing a sacrificial layer on a surface of the member, disposing a first agent within the member to obtain a predetermined concentration of the agent at said surface of the member, annealing the member, and removing the sacrificial layer to expose said surface of the member, wherein said surface has a post-process effective work function that is different from the initial value.

23 Claims, 4 Drawing Sheets

U.S. PATENT DOCUMENTS

| | | | |
|---|---|---|---|
| 7,768,072 B2* | 8/2010 | Tsai et al. | 257/368 |
| 2001/0046749 A1* | 11/2001 | Tavkhelidze et al. | 438/380 |
| 2002/0033188 A1* | 3/2002 | Shakouri et al. | 136/201 |
| 2002/0153819 A1* | 10/2002 | Seo et al. | 313/337 |
| 2004/0265592 A1* | 12/2004 | Nakamoto | 428/408 |
| 2005/0018467 A1* | 1/2005 | Naaman et al. | 365/145 |
| 2005/0059198 A1* | 3/2005 | Visokay et al. | 438/199 |
| 2005/0098833 A1* | 5/2005 | Visokay | 257/369 |
| 2005/0104185 A1* | 5/2005 | Shimogishi et al. | 257/686 |
| 2007/0257605 A1 | 11/2007 | Son et al. | |
| 2008/0258137 A1* | 10/2008 | Takshi et al. | 257/40 |

FOREIGN PATENT DOCUMENTS

| | | |
|---|---|---|
| WO | 9736693 A | 10/1997 |

OTHER PUBLICATIONS

A. E. Souzis, M. Seidl, W. E. Carr, H. Huang; Electronic surface changes induced in silicon by hydrogen, oxygen, and cesium coverages; J. Vac. Sci. Technol. A; May 1989; pp. 720-723; vol. 7, Issue 3.

A. E. Souzis, H. Huang, W. E. Carr, M. Seidl; Catalytic oxidation of silicon by cesium ion bombardment; J. Appl. Phys. 69, 452 (1991); DOI:10.1063/1.347684; Issue Date: Jan. 1, 1991.

J. P. Girardeau-Montaut, C. Girardeau-Montaut, M. Afif; Enhancement of photoelectric emission sensitivity of tungsten by potassium ion implantation; Appl. Phys. Lett. / vol. 66 / Issue 15; Apr. 10, 1995.

Hubert Gnaser; Exponential scaling of sputtered negative-ion yields with transient work-function changes on Cs+-bombarded surfaces; Physical Review B; Dec. 15, 1996; vol. 54, No. 23.

Y. W. Ko; S. I. Kim; Electron emission and structure properties of cesiated carbon films prepared by negative carbon ion beam; Journal of Applied Physics; Sep. 1, 1997; vol. 82, Issue 5; 2631 (1997); DOI:10.1063/1.366077.

Hideyuki Yamazaki, Shin-Ichi Nakamura; Work-function changes in high-dose B-implanted Si with keV Cs+ bombardment; Physical Review Online Archive; Nov. 20, 1998; vol. 59, Issue 19; pp. 12298-12300.

D. Vouagner, CS. Beleznai, J. P. Girardeau-Montaut; Characterization of the photoelectric effect on K+-implanted W samples; Applied Surface Science; vols. 138-139, Jan. 1999, pp. 517-521.

Florian Banhart; Irradiation effects in carbon nanostructures; Mar. 15, 1999; Rep. Prog. Phys. 62 (1999) 1181-1221. Printed in the UK.

C.B. Yarling; History of industrial and commercial on implantation 1906-1978; Journal of Vacuum Science and Technology A; J. Vac. Sci. Technol. A vol. 18, Issue 4, pp. 1746-1750 (Jul. 2000).

Yuriy Kudriavtsev, Rene Asomoza; Work function change caused by alkali ion sputtering of a sample surface; Applied Surface Science; vol. 167, Issues 1-2, Oct. 16, 2000, pp. 12-17.

Pushkar Ranade, Hideki Takeuchi, Tsu-Jae King, Chenming Hu; Work Function Engineering of Molybdenum Gate Electrodes by Nitrogen Implantation; Electrochem. Solid-State Lett., vol. 4, Issue 11, pp. G85-G87 (Nov. 2001).

R. G. Musket, M. Balooch; Creation of stable, low work function surfaces on Si by implantation of 3 keV Cs+; Journal of Vacuum Science and Technology A; vol. 20, Issue 6, pp. 2049-2051 (Nov. 2002).

Zhanping Li, Takahiro Hoshi, Retsu Oiwa; Characteristics of ultra-low-energy Cs+ ion beam bombardments; Applied Surface Science; vols. 203-204, Jan. 15, 2003, pp. 323-328.

S. Ferrari, M. Perego, M. Fanciulli; Quantitative depth profiling at silicon/silicon oxide interfaces by means of Cs+ sputtering in negative mode by ToF-SIMS: a full spectrum approach; Applied Surface Science; vols. 203-204, Jan. 15, 2003, pp. 52-55.

Villegas A, Yuriy Kudriavtsev, Godines A, Asomoza R, Work function change caused by alkali ion sputtering, Applied Surface Science; vols. 203-204, Jan. 15, 2003, pp. 94-97.

Van Der Heide P. A. W., Lim M. S., Perry S. S., Bennett J; Transient effects induced through ripple topography growth during Cs+ depth profile analysis of Si at high incidence angles; Applied surface science ISSN 0169-4332, Jan. 15, 2003, vol. 203-04 (935 p.) [Document : 4 p.] (5 ref.), pp. 156-159 [4 page(s) (article)].

Do-Hyung Kim, Hoon-Sik Jang, Chang-Duk Kim, Dong-Soo Cho, Hee-Dong Kang, Hyeong-Rag Lee; Enhancement of the field emission of carbon nanotubes straightened by application of argon ion irradiation; Chemical Physics Letters; vol. 378, Issues 3-4, Sep. 5, 2003, pp. 232-237.

W. M. Tsang, S. P. Wong; Effect of tungsten implantation on electron field emission properties of ion-beam-synthesized SiC layers; Applied Physics Letters; Apr. 19, 2004; vol. 84, 3193 (2004); DOI:10.1063/1.1705730.

P. A. W. Van Der Heide, C. Lupu, A. Kutana and J. W. Rabalais; Factors affecting the retention of Cs+ primary ions in Si; Applied Surface Science; vol. 231-232, Jun. 15, 2004, pp. 90-93.

T. Wirtz, H. -N. Migeon; Work function shifts and variations of ionization probabilities occurring during SIMS analyses using an in situ deposition of Cs0; Surface Science; vol. 561, Issues 2-3, Jul. 20, 2004, pp. 200-207.

Jun Yuan, Jason C.S. Woo; Tunable Work Function in Fully Nickel-Silicided Polysilicon Gates for Metal Gate MOSFET Applications; Feb. 2, 2005; IEEE Electron Device Letters, vol. 26, issue 2, pp. 87-89.

W.D. Yu, J.H. Zhang, X. Wang, X.M. Li, X.D. Gao; Characterization and field-emission property of aligned porous carbon nanotube film by hydrogen-ion implantation; Applied Physics A: Materials Science & Processing; Jun. 2005; vol. 81, No. 1; pp. 169-172.

I.R. Jankov, R.N. Szente, I.D. Goldman, M.N.P. Carreno, M.A. Valle, M. Behar, C.A.R. Costa, F. Galembeck, R. Landers; Modification of electrode materials for plasma torches; Surface and Coatings Technology; vol. 200, Issues 1-4, Oct. 1, 2005, pp. 254-257.

Jung-Ah Lee, Jin-Woo Lee, Dae-Sung Yoon, Kyeong-Kap Paek, Yun-Hi Lee, Beong-Kwon Ju; Improvement of Field-Emission Properties of Screen Printed Carbon Nanotube Films via Argon Plasma Treatment; Journal of the Electrochemical Society; Apr. 10, 2006; vol. 153, Issue 6, pp. H111-H114 (2006).

P. Chen, T. Janssens, W. Vandervorst; Steady-state Cs surface concentration on Si and Ge after low energy Cs+ bombardment by SIMS; Applied Surface Science; vol. 252, Issue 19, Jul. 30, 2006, pp. 7239-7242.

J. Brison, N. Mine, S. Poisseroux, B. Douhard, R.G. Vitchev, L. Houssiau; Measurement and modeling of work function changes during low energy cesium sputtering; Surface Science; vol. 601, Issue 6, Mar. 15, 2007, pp. 1467-1472.

* cited by examiner

METHOD OF MAKING LOW WORK FUNCTION COMPONENT

STATEMENT REGARDING FEDERALLY SPONSORED RESEARCH & DEVELOPMENT

This invention was made with Government support under contract number DE-FC26-04NT42324 awarded by The United States Department of Energy. The Government has certain rights in the invention.

BACKGROUND

The invention relates generally to the area of low work function (LWF) materials. More specifically, the invention relates to a method of fabricating LWF components, such as electrodes.

Processing steps involved in the fabrication of a particular member of an electronic component may be detrimental to the fabrication efficiency and reliability of other members constituting the component. One situation in point relates to the fabrication of components that display a low work function. Development of cost effective methodologies that can be used to fabricate LWF components such as LWF electrodes reliably and which are compatible with an infrastructure as is conventionally used for the fabrication of LWF components is one of the challenges facing present day LWF component fabrication technology.

Methodologies that allow for the fabrication of robust and reliable LWF components, and at the same time, that are compatible with the existing fabrication methodologies employed to fabricate other parts of a component would therefore be highly desirable.

One of the current paradigms in ensuring the quality of fabrication devices containing LWF components consists in fabricating the LWF components separately from any other parts constituting the device, and integrating the LWF component into the device upon completion of all those steps involved in the fabrication of the other parts of the device that are detrimental to the LWF component.

Any fabrication methodology that aims to improve the health of fabricated LWF components while adversely impacting or limiting the efficiency of fabrication of the other parts of a device may not be economically viable.

A fabrication methodology that is compatible with the existing infrastructure as has been used conventionally to fabricate LWF components such as, thin film deposition systems such as sputtering systems, and ion implantation systems, and does not place adverse restrictions on the existing methodologies used in the fabrication of the other parts, such as requiring changes in such existing methodologies would therefore, be highly desirable.

BRIEF DESCRIPTION

Embodiments of the invention are directed towards a method for fabricating the LWF component.

In accordance with one exemplary embodiment of the invention, a method for fabricating a component is disclosed. The method includes: providing a member having an effective work function of an initial value, disposing a sacrificial layer on a surface of the member, disposing a first agent within the member to obtain a predetermined concentration of the agent at said surface of the member, annealing the member, and removing the sacrificial layer to expose said surface of the member, wherein said surface has a post-process effective work function that is different from the initial value.

These and other advantages and features will be more readily understood from the following detailed description of preferred embodiments of the invention that is provided in connection with the accompanying drawings.

DETAILED DESCRIPTION

In the following description, whenever a particular aspect or feature of an embodiment of the invention is said to comprise or consist of at least one element of a group and combinations thereof, it is understood that the aspect or feature may comprise or consist of any of the elements of the group, either individually or in combination with any of the other elements of that group.

In the following specification and the claims that follow, the singular forms "a," "an," and "the" include plural referents unless the context clearly dictates otherwise.

As used herein, the term "effective work function" refers to the minimum energy (usually expressed in electron volts) needed to remove an electron from a neutral solid to a point immediately outside the solid surface (or energy needed to move an electron from the Fermi energy level into vacuum). Here "immediately" means that the final electron position is far from the surface on the atomic scale but still close to the solid on the macroscopic scale. Extraction of electrons from the surface of a metal can be induced via several methods of excitation based on different phenomena, such as photoelectric phenomena, thermionic phenomena, and electric field phenomena.

As used herein, the term "agent" refers to any material that is to be disposed within the bulk or on the surface of a member. The means for such disposal include, but are not limited to, diffusion via for instance thin film deposition techniques such as sputtering or evaporation, or ion implantation. Suitable non-limiting examples of agents include, chemical entities, particulate matter, or combinations thereof.

As used herein, the term "member" refers to any part of a component within which it is desired to dispose agents. It may sometimes also be referred to as "substrate" in line with conventional usage in thin film deposition technology. The member or substrate will be understood to mean any entity, a change in whose work function is being attempted.

As used herein, the term "manufacturing" refers to any operation that could potentially disrupt the surface chemistry, and/or surface morphology, and/or surface properties of the member. Examples of such operations include, but are not limited to, etching, cleaning, masking, coating, heat treatment, annealing, or combinations thereof.

As used herein, the term "combine" refers to any chemical or physical mechanism or operation whereby two physical or chemical entities are placed or disposed in vicinity of each other. Suitable non-limiting examples of such processes include, physical adhesion, chemical reaction, or combinations thereof.

As used herein, the term "sacrificial layer" refers to a layer that is disposed on any substrate with an intent to cover and thereby segregate said surface of the substrate from ambient conditions. The purpose of such segregation may be to protect said surface from the ambient. As the name may suggest, the sacrificial layer, while providing such protection, may get sacrificed, i.e., damaged or destroyed. Also, the sacrificial layer may or may not be removed after all manufacturing operations of said component and/or other parts constituting the device (of which the component is a part) have been completed.

As used herein the term "post-process," when used in the context of discussion of a component indicates that all manufacturing operations of said component and/or other parts constituting the device (of which the component is a part) have been completed. In similar vein, the term "pre-process," when used in the context of discussion of a component indicates that all manufacturing operations of said component and/or other parts constituting the device are yet to be completed.

As used herein, the term "member-sacrificial-layer-complex" (MSLC) refers quite generally to an entity that includes a member, a sacrificial layer, and an interface between the member and the sacrificial layer.

As used herein, the term "within," when used in the context of discussion of any physical entity may refer to the bulk of the physical entity or it may refer to a surface of the physical entity, or it may refer to both the bulk and the surface of the physical entity.

As used herein, the term "green," when used in the context of a discussion a physical entity, such as a component, conveys that the component is as yet in its pristine "pre-processed" state, i.e., none of the fabrication steps that eventually result in the component displaying new changed properties, such as, an effective work function that is lower than its initial value, have as yet been initiated. For example, a "green component" refers to a component on which no processing steps, that cause the component to display desired properties, have been performed.

Figure 1:
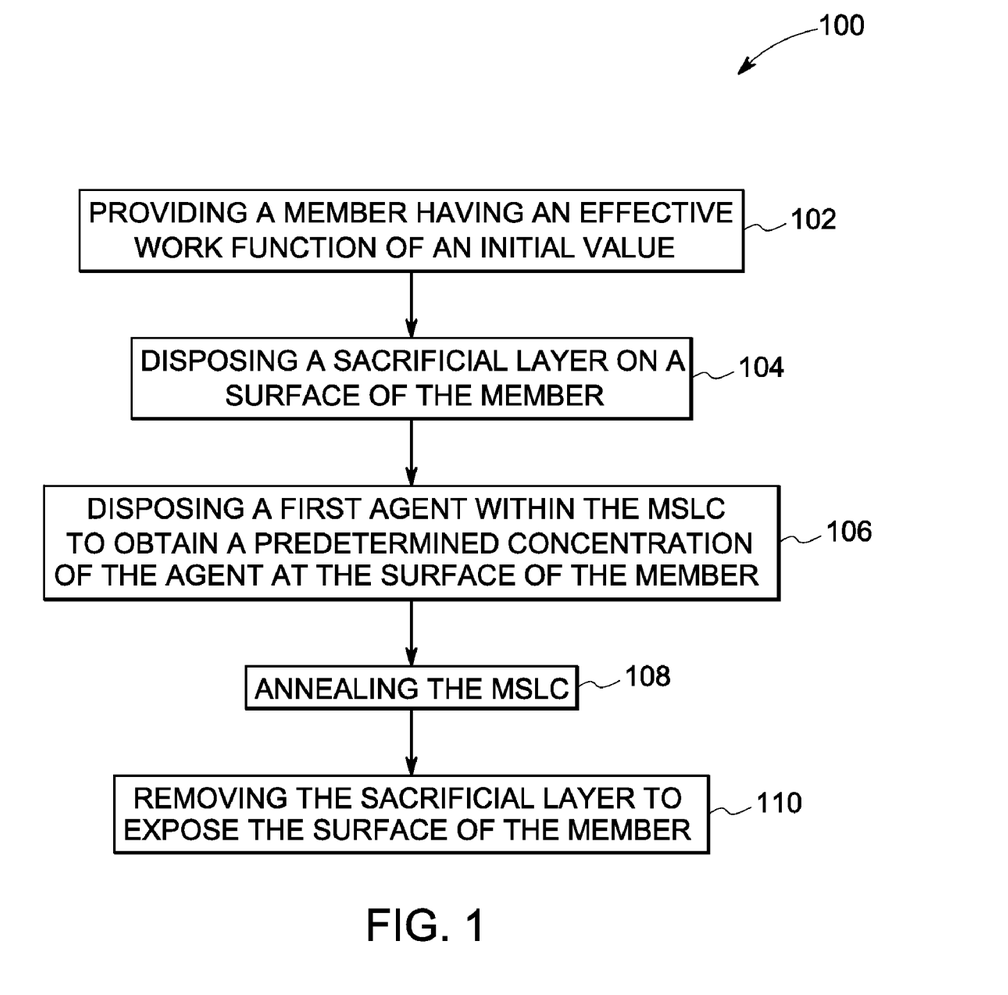
FIG. 1 is a flow chart of a process for fabricating a LWF component in accordance with an exemplary embodiment of the invention.

In one embodiment of the invention, a method 100 for fabricating a component is provided as shown in FIG. 1. Step 102 of the method 100 includes providing a green component or "member" having an effective work function of an initial value. This is followed by step 104, which includes disposing a sacrificial layer on a surface of the member. As per a definition mentioned earlier, the combined entity resulting after this step 104, containing an interface between the member and sacrificial layer is referred to as the MSLC. The next step 106 includes disposing a first LWF agent within the MSLC to obtain a predetermined concentration of the first LWF agent at said surface of the member. It is likely that such disposition of the agent within the member will result in a change in the electrical properties of the member. Step 106 is now followed by step 108 that includes annealing the MSLC. The final step 110 includes removing the sacrificial layer to expose the surface of the member, wherein the member now contains, within itself, the LWF agent. The surface at this post-process stage, has an effective work function value that is different from the initial value.

In one embodiment of the method 100, the green component can include semiconductors, or metals, or insulators, or combinations thereof. Suitable non-limiting examples of semiconductors include, silicon, germanium, gallium nitride, silicon carbide, gallium arsenide, and indium nitride. Suitable, non-limiting examples of metals include, aluminum, copper, silver, and gold. Suitable, non-limiting examples of insulators include, glass, quartz, and sapphire. The green component can also include a combination of different layers of different materials such as, a layer of metal on semiconductor, non-limiting examples of which are a layer of gold on silicon, a layer of aluminum on silicon, and or a layer of copper on silicon. The green component can also include a layer of metal on insulator, wherein the metal includes a material selected from the list consisting of aluminum, copper, silver, and gold, and the insulator includes a material selected from the list consisting of glass, quartz, and sapphire.

The green member has an initial work function, the modification of which, for example, to a lower value may be desired. In one embodiment of the method 100 above, such a modification may be achieved by disposing, within the green member, a suitable first LWF agent which by itself has a suitable work function, such that the disposition of the first LWF agent within the green component results in a lowering of the work function of the member. Now, by their very nature LWF materials are reactive and/or volatile, and it is likely that in improperly controlled environments, the LWF material will combine with one or more species present in the environment to give products that impede the development of LWF properties within the member. Further, the LWF component likely forms, or is likely intended to be, a part of a device that contains other parts as well. It is possible that some of the steps involved in the manufacture of the other parts are detrimental to the LWF component. Again, the fabrication of such LWF components often itself involves surface treatments and/or surface coatings with different materials before the component displays the desired work function. These surface treatments and/or surface coatings are susceptible to damage during the fabrication of the other parts constituting the component. It may be unviable to modify, for a variety of technological, economic, or environmental reasons, processes that are followed for the manufacture of the other parts. Similar reasons may also limit the ability to integrate the LWF component with the other parts constituting the device until all such manufacturing operations of these other parts are complete and a favorable ambient environment has been provided/restored. A method of fabricating a LWF component that does not impede or require unnecessary modifications of the manufacturing processes of other parts constituting the device would therefore be highly desirable. For the reasons mentioned above, in one embodiment of the invention, a sacrificial layer is disposed on to the component before disposing the LWF agent within it. The sacrificial layer serves as a protective layer, shielding the component and the agent that is disposed within the component, from potentially harmful exposure to harsh ambient environments.

The sacrificial layer can be disposed on the green component by any known means, including, but not limited to, plasma enhanced chemical vapor deposition (PECVD), low pressure chemical vapor deposition (LPCVD), sputtering, thermal evaporation, pulsed laser deposition, or spin or spray coating. It is likely that the composition of the sacrificial layer is one of the factors determining a choice of the disposition method.

In one embodiment of the invention, the sacrificial layer includes a material selected from the group consisting of oxides, nitrides, carbides and polymers. These oxides, nitrides, and carbides, may be formed via the processes of oxidizing, nitriding, and carburizing respectively. Non-limiting examples of materials from which the sacrificial layer may be composed include, silicon dioxide, silicon carbide, silicon nitride, polysilicon, and photoresists. In one embodiment of the method 100, the sacrificial layer may be disposed to have a thickness within the range from about 10 nm to about 500 nm. In one embodiment of the method 100, the sacrificial layer may be disposed to have a thickness within the range from about 500 nm to about 1000 nm. In one embodiment of the method 100, the sacrificial layer may be disposed to have a thickness within the range from about 1000 nm to about 5000 nm.

Once the sacrificial layer has served its purpose, it may be removed via any suitable physical and/or chemical process. Non-limiting examples of such processes include, wet etching, plasma etching, and sputtering.

As was mentioned above, it is the presence of a LWF agent within the member that results in a desired modification, such as a reduction of the work function of the member. An agent may be disposed within the member using a variety of techniques that are well known in the art, such as diffusion and/or ion implantation (discussed below). Via the technique of ion implantation, it is possible to dispose ions of the agent at desired depths within a substrate. In the presently disclosed embodiments of the method 100, the substrate includes the MSLC. Further, the LWF agent may be deposited on the member using any known film deposition techniques, provided they include or are followed by a step that facilitates diffusion of the LWF agent within the member. These techniques for disposing a LWF agent within the MSLC are discussed later within this description. It is likely that the concentration of the agent at the surface of the member is one of the factors determining the effective work function of the component. In one embodiment of the method 100, the concentration of the agent on the surface of the member is within the range from about 50% to about 100%. In another embodiment, the concentration of the agent on the surface of the member is within the range from about 25% to about 50%. In yet another embodiment, the concentration of the agent on the surface of the member is within the range from about 1% to about 25%.

The concentration of the first agent at the surface is a function of a plurality of factors that may be interdependent. For instance, it may depend on the kinetic energy of the incident flux of agent, because the kinetic energy of the incident flux of agent is one of the factors determining the depth profile of the agent within the member. Another factor on which the concentration depends is the annealing protocol that is followed subsequent to disposing the agent within the member. Any manufacturing steps that need to be taken in connection with the fabrication of the LWF component or otherwise, may dictate, at least partially, the depth profile requirement of the disposed agent. Thus, in one embodiment of the method 100, the agent is disposed within the member so that a maxima of the concentration, within the MSLC, of the first agent, is located within a distance of about 1 nanometer (nm) from the interface between the member and the sacrificial layer.

In accordance with the method 100 of fabricating a LWF component, a predetermined concentration of an agent is achieved on a surface of the component. The agent can be present in the form of a layer at the surface the component. (In this sense, the electrical contact serves as a "substrate" for the layer.) Such layers may be monoatomic, or they may be thin film layers containing up to hundreds of monoatomic layers. Suitable examples of agents include, but are not limited to, alkali metals such as cesium, sodium, potassium, and other materials such as, carbon, tungsten, tungsten carbide, lanthanum hexaboride, barium oxide, strontium oxide, strontium, rubidium, barium oxide, barium nitride, titanium dioxide, diamond like carbon (DLC), and combinations thereof. Suitable examples of materials from which such substrates may be composed include, but are not limited to, silicon, platinum, gold, and combinations thereof. A suitable non-limiting example of a material from which a monoatomic layer may be composed is cesium. Specific examples of layer-substrate combinations suitable for use in some embodiments include, but are not limited to, barium oxide deposited on silicon, barium nitride deposited on silicon, titanium dioxide deposited on platinum, DLC deposited on silicon, cesium deposited on gold, $LaB_6$ and ZrO deposited on tungsten.

In one embodiment of the method 100, a further step of disposing a second agent at the surface is included. This second agent may result in a further change in the effective work function of the member. In another embodiment of the method 100, the first agent may be made to combine with other species present within the member to form new agents. It is also possible that the incident flux of agent is composed of a plurality of chemical entities that combine together, during the passage to the MSLC, or at the surface of the MSLC, or at the interface within the MSLC, or within the bulk of the MSLC, to form new species. The presence of such new species may themselves serve as agents and may result in a change in the work function displayed by the member.

There are several factors, which can be interrelated, which together determine the final distribution of the agent within the MSLC or within the final LWF member. In certain operational conditions of fabrication, some of these factors may be more important than others. These factors include, but are not limited to, the kinetic energy of the incident beam of agent, the choice of agent, whether there are present a plurality of agents in the incident flux of agent, and if so, then whether said plurality of agents undergo combination to produce new agents, the temperature of the MSLC during the disposition of the agent within it, the annealing protocol that is followed during the process of fabrication of the LWF component, amongst others.

Figure 2:
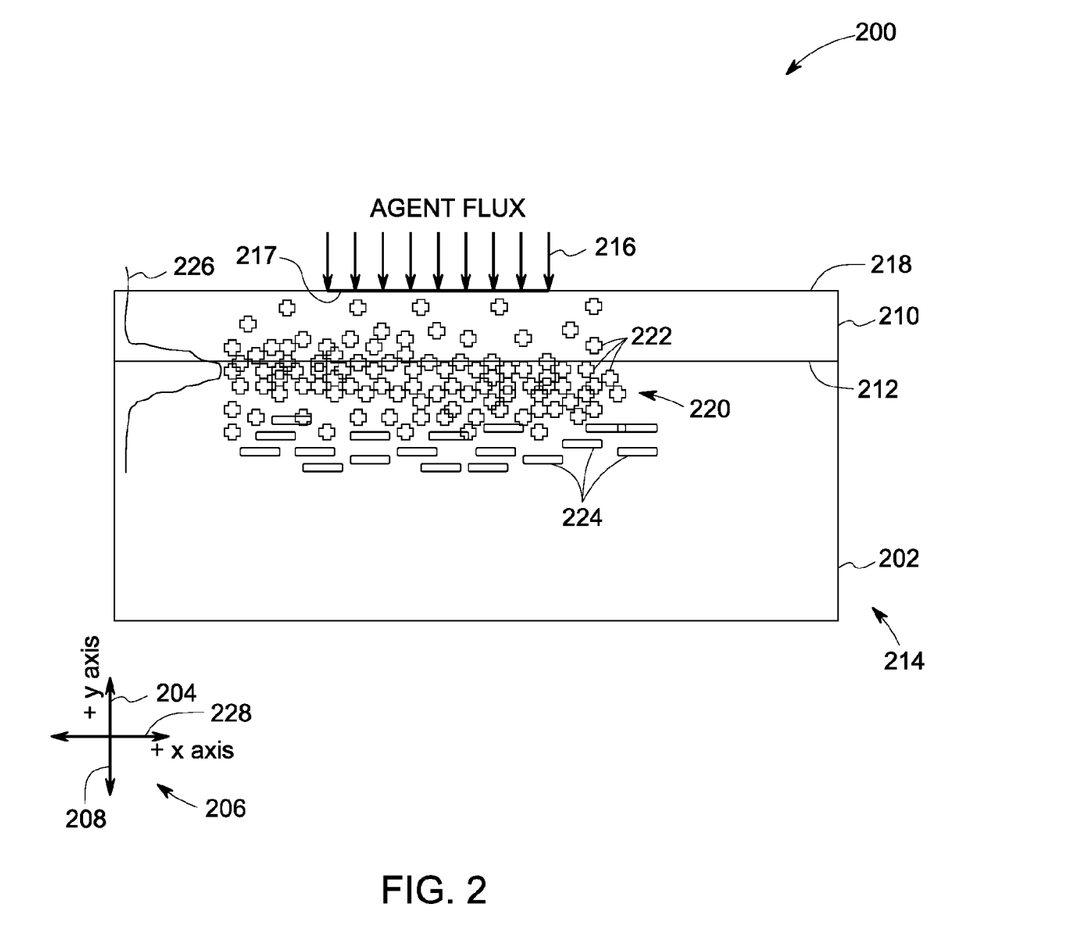
FIG. 2 is a schematic representation of a member-sacrificial layer-complex (MSLC) during an intermediate stage of a fabrication of a LWF component.

According to an embodiment of the method 100, a LWF component may be fabricated. Such an in-process LWF component at the intermediate MSLC stage 104 is shown in FIG. 2. As per step 102 of the method 100, a member 202 has been provided earlier. The member is oriented so that one of its physical dimensions, say, a height lies substantially along a positive (+) y axis 204 of coordinate system 206. A depth direction of the member 202 may therefore be understood to be substantially along the negative (−) y axis 208. The member 202 can be composed of any of the materials, as discussed herein. As per step 104 of the method 100, on this member 202, also along the height direction 204, is disposed a sacrificial layer 210 which can be composed of any of the materials as discussed herein. The disposition of the sacrificial layer 210 on to the member 202 results in the formation of an interface 212 between the sacrificial layer 210 and the member 202. Quite generally, the member 202, the sacrificial layer 210, and the interface 212 may together be referred to as a member-sacrificial-layer-complex (MSLC) 214. As per step 106 of the method 100, a flux 216 of a desired agent is then made to contact a region 217 of surface 218 of the MSLC. The flux of agent can be provided through any of the techniques, as described herein. As a result of such contact, the agent gets disposed within the MSLC 214. A thus obtainable disposition of the agent within the MSLC 214 is indicated by reference numeral 220. The disposition 220 is such that there is a predetermined concentration of the agent in the vicinity of the interface 212. The agent that has thus been disposed within the MSLC 214 is indicated by reference numeral 222. At this stage, as per step 108 of the method 100, an annealing of the MSLC 214 is performed. Further, as a non-limiting event in this example, and as discussed later, dipoles 224 are shown generated within the MSLC 214, as a result of disposition 220 of agent 222. A non-limiting example profile of concentration of the thus disposed agent 222, as a function of the depth 208 from the surface 218, indicated by reference numeral 226, is shown superimposed on the MSLC 214. It is understood that, the indicated (+) x axis 228 represents a scale in the coordinate system 206 on which is plotted a concentration of the disposed agent 222. In other words, the value of the concentration profile 226, read at a point along the y axis 204-208, represents the concentration of the agent at that point.

Figure 3:
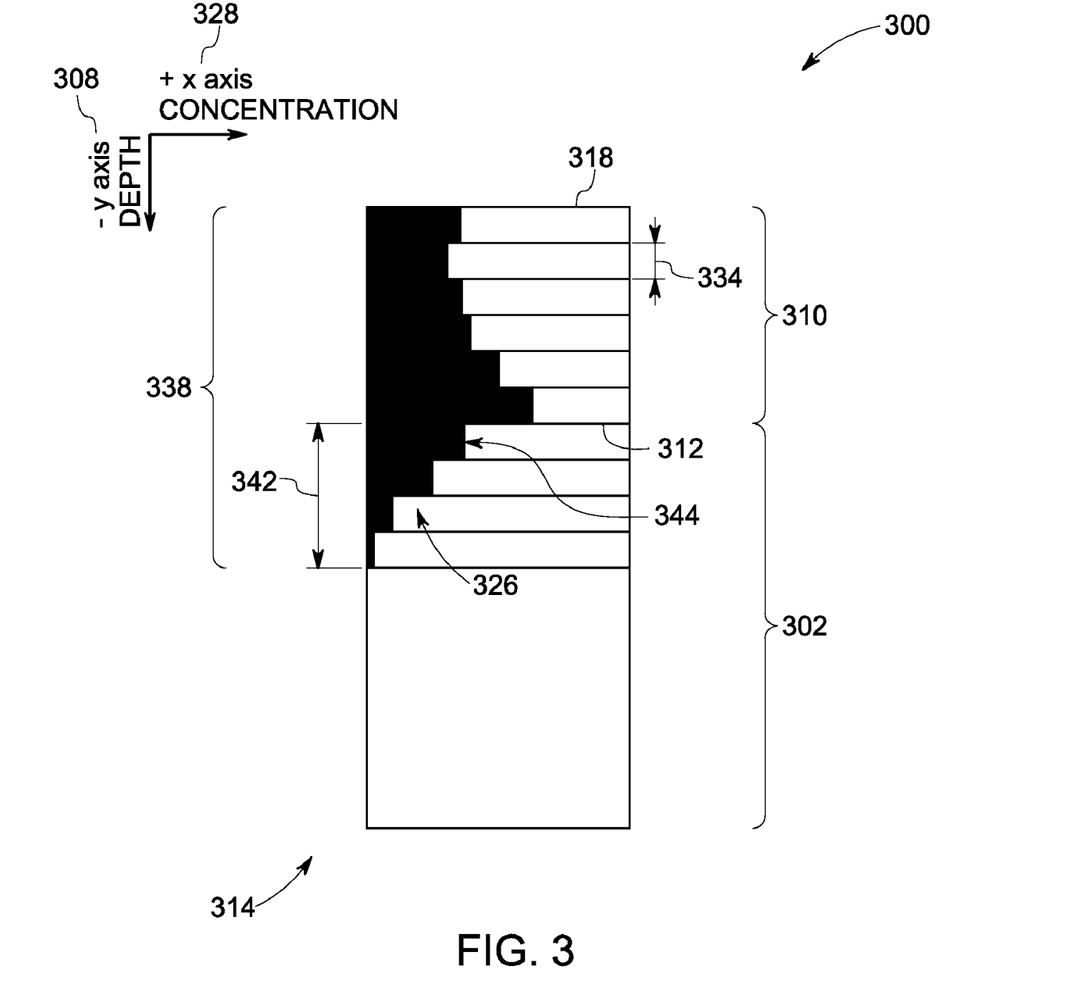
FIG. 3 is a schematic representation of a MSLC during an intermediate stage of a fabrication of a LWF component showing a depth profile of disposed agent within the MSLC.

FIG. 3 represents a cross sectional view of a LWF component 300 that is in-process of being fabricated via an embodiment of the method 100. The said in-process LWF component is depicted after steps 102 through 108 have been performed. The member, the sacrificial layer, and the interface between the member and sacrificial layer, are indicated via reference numerals 302, 310, and 312 respectively, and as earlier, are collectively referred to as a MSLC 314. In the present example, the member 302 is composed of silicon, and the sacrificial layer 310 is composed of silicon dioxide and is about 100 nm in height. This figure presents the results of measurements of concentration of a disposed agent, which in the present example is cesium, as a function of the depth from the surface 318. Such concentration versus depth profile 326 of disposed agent (not shown) may be obtained via several methods well known in the art. In the present case, the depth profile was obtained via the method of Rutherford back scattering. The concentration versus depth profile 326 is indicated superimposed on to the MSLC 314. As earlier, a depth direction of the MSLC 314 lies substantially along a negative (−) y axis 308, and a positive (+) x axis 328 indicates the direction of increasing concentration of the disposed agent i.e., its value along the (+) x axis at a particular depth within the MSLC indicates the concentration of the agent (not shown) at that particular depth. For the purposes of illustration, the concentration versus depth profile 326 in the present figure is plotted in discrete (as opposed to the concentration versus depth profile 226 of FIG. 2 which, without loss of generality, is shown as being continuous) steps. Accordingly, the depth from the surface 318 is shown divided into 20 nanometer intervals, as shown depicted by reference numeral 334. In the illustrated embodiment, the agent is implanted to a depth 338 within the MSLC. A portion 342 of the depth 228 lies within the member. Each of the concentration levels 344 of the concentration profile 326, indicate the relative (as opposed to "absolute") concentration at the corresponding depth. The concentration versus depth profile 326 within the MSLC 314 is such that such that there is a predetermined concentration of the agent at the interface 312. It is clear that nearly all the agent that is implanted within the MSLC resides within a depth of about 200 nm of the surface 318.

An agent may be disposed within the MSLC using a variety of techniques that are well known in the art. One such technique is that of ion implantation. In this technique it is possible to dispose the agent up to desired depths within a substrate (which in the present case, is the MSLC, but in other embodiments discussed herein, can also be just the member). Within this technique, a flux of a desired agent possessing a certain kinetic energy, is made to contact a well defined region of a surface of a substrate.

Ion implantation techniques present several advantages for engineering LWF components, as are well known in the art. For instance, the near surface implantation (disposition) of agent is relatively precise, with typical depth control of the order of nanometers being achievable. Also, planar deposition on a surface of the MSLC is possible. Furthermore, this technique is a standard semiconductor technology processing technique in general use. Therefore, additional equipment may not be required to incorporate embodiments of the present method 100 into existing standard semiconductor technology processing techniques. Another advantage is the fact that ion implantation techniques enable fabrication of LWF components that are stable against exposure to ambient environment, because, as has been discussed herein, the LWF agent is implanted (disposed) within the bulk of the substrate, where it is protected from exposure to the ambient environment. In FIG. 2, for example, a flux of an agent indicated via reference numeral such 216 is incident on a region 217. Because the agent possesses kinetic energy when it contacts the surface of the substrate, such as the surface 218, the agent penetrates the surface, and gets embedded at different depths within the substrate. An example of such an embedded disposition is indicated via reference numeral 220. The technique of ion implantation can be repeated for different agents and/or different regions of contact, allowing therefore, to engineer a concentration profile of one or more agents within the substrate. In one embodiment of the method 100 disclosed herein, the features of the ion implantation technique mentioned above may allow enhanced flexibility in the choice of thickness and/or composition of the sacrificial layer.

It is pointed out that there is an incomplete theoretical understanding of the mechanisms whereby the said change of work function is achieved when the agents are implanted via ion implantation. One of the possible mechanisms for example, is the formation of dipoles on the surface of the member, such as for example indicated via reference numeral 224 in FIG. 2, which in turn helps in the member "displaying" an effective work function that is lowered beyond what was expected on the basis of concentration of the implanted agent.

The presence of dipoles within the member likely results in a lowering the work function. Therefore, in one embodiment of the method 100, in addition to the steps described above, there can be an additional step that includes forming dipoles within the bulk of the member. Such dipoles may be formed via an oxygen treatment of the member to introduce oxygen within the member, followed, if needed, by a heating protocol. The introduction likely happens through the process of diffusion across the surface of the member. The formation of such dipoles may result in the member displaying an effective work function that is lower than the effective work function it displayed prior to the formation of dipoles. It is possible that the distribution of such dipole regions relative to the distribution of the agent within the member is one of the factors determining the effective work function of the member.

Ion implantation techniques also introduce additional considerations during the fabrication of a LWF component. For instance, the process of implanting the agents within the MSLC may result in mechanical stress akin to "sputtering" of the sacrificial layer, whereby the sacrificial layer progressively loses its integrity. In such situations, it may be advantageous to choose the thickness of the sacrificial layer so that the sacrificial layer has sufficient mechanical strength and/or bulk so that its functionality is not compromised due to said loss of material. Further, it is likely that ion implantation techniques introduce interstitial and vacancy defects, and other defects, in the member. Therefore, to repair the surface subsequent to the agent implantation, an annealing of the member may be performed. It is pointed out however, that annealing may also facilitate diffusion of the implanted agent, which in turn results in an increase of the "volume" within the member that is occupied by the agent.

Figure 4:
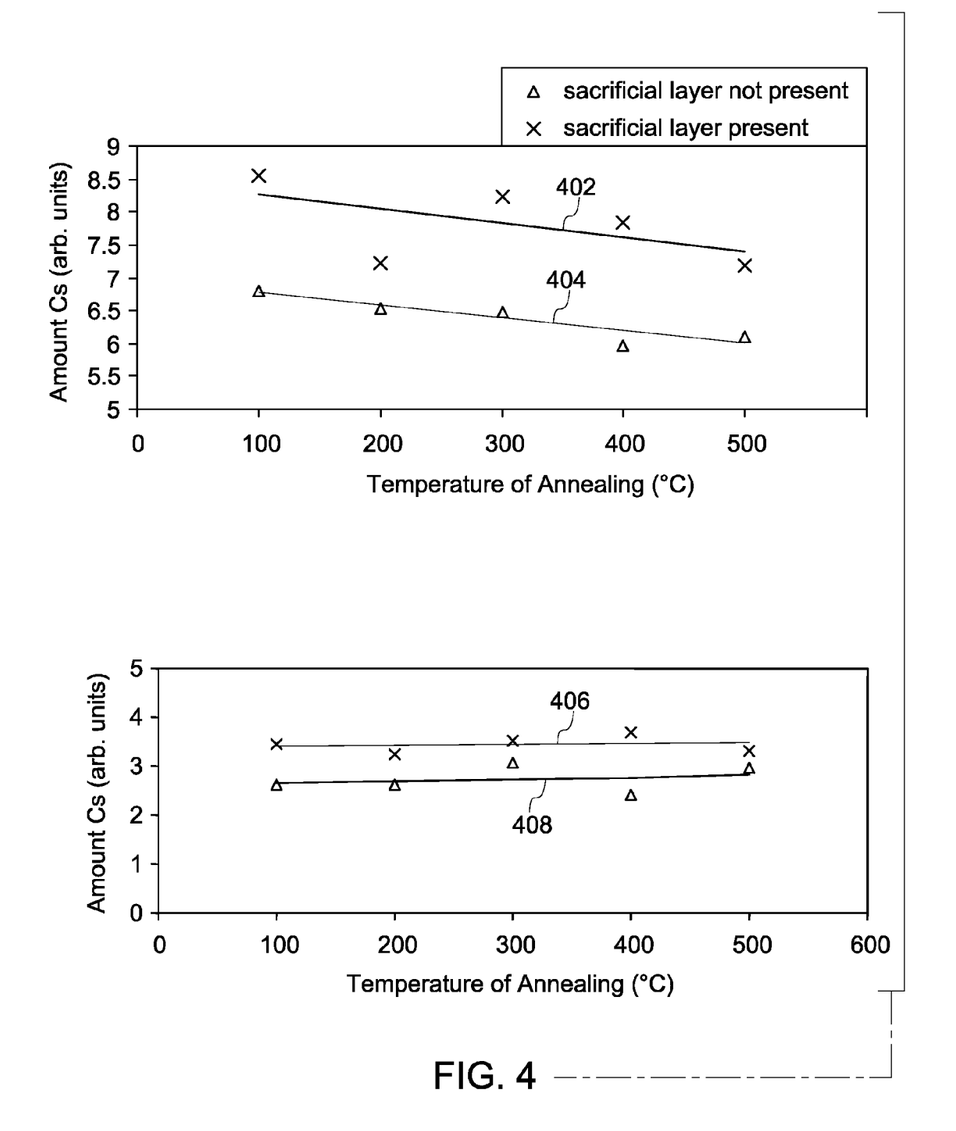
FIG. 4 is a graphical representation of an amount of implanted cesium within a member as a function of kinetic energy of incident flux of cesium, and as a function temperature of annealing of the member, in accordance with an exemplary embodiment of the invention.

The aspects of the technique of ion implantation, as discussed above, are now discussed quantitatively. A result of implanting an agent via the method of ion implantation in accordance with one embodiment of the method 100 is shown in FIG. 4, wherein an incident flux of cesium ("agent"), having a kinetic energy of about 300 kilo electronvolt (keV) is incident on to a first surface of the member. FIG. 4 shows the results 402 of measurement of amount of cesium within the member when a sacrificial layer (composed of silicon dioxide and having a thickness of about 100 nm) is present on the first surface of the member. In this case, the "member" may, more correctly be referred to as an "MSLC." FIG. 4 also shows the results 404 of the measurement of amount of cesium within the member when no other layer, such as for instance a sacrificial layer, is present on the first surface of the member, i.e., the member is "bare." Also shown in FIG. 4 are results, 408 and 406 respectively, of similar measurement of amount of cesium within members when the incident flux of cesium has a kinetic energy of about 225 keV. Similar to the previous case, the results are shown for a MSLC 406 and a "bare" member 408. The results 402, 404, 406, and 408, are shown as a function of temperature of annealing, of the member or the MSLC, as the case may be, and were measured after annealing, for about 1 hour, had been completed. The amount of cesium implanted within a depth of about 100 nm of the interface was determined via the method of Rutherford back scattering. It is clear from the FIG. 4 that, the amount of implanted cesium has a dependence on the kinetic energy of the incident flux of cesium, wherein the amount increases with increasing kinetic energy. From FIG. 4, it is also evident that the variation of annealing temperature over wide range, in the instant examples over about 100° C. to about 500° C., has little effect on the amount of cesium present within the measured depth. It may therefore be gathered that annealing temperatures within the given range do not induce substantial migration of the implanted cesium. Further, as is known in the art (see for example, Musket et al., J. Vac. Sci. Technol. A 20(6), November/December 2002), diffusion of cesium is known to occur at temperatures exceeding about 600° C., and thus, at temperatures nearing or above this temperature, time of annealing may be reduced to prevent diffusion of cesium away from the surface.

In one embodiment of the method 100, the agent is disposed within the MSLC through the process of diffusion across its surface. It is likely that an annealing step, or any other step wherein thermal energy is supplied to the member would aid the process of diffusion. For instance, any suitable known thin film deposition methods may be used to dispose the agent on the surface of the member. The thus disposed agent may then, under the influence of its thermal energy, diffuse across the surface to within the bulk of the member. Non-limiting examples of suitable thin film deposition methods include, thermal evaporation, sputtering, pulsed laser deposition.

As described above, in one embodiment of the invention, it may be advantageous to anneal the substrate (the member, or the MSLC, as the case may be), via a suitable protocol that includes suitable time and temperature regimes. It is likely that such annealing may result in an amelioration of the damage that is likely caused to the surface, or that is likely caused within the bulk of the substrate, as a result of a prior ion implantation of agents. As was discussed above, the damage may include creation of defects such as dislocations. It is likely that such annealing may facilitate the agent to settle into equilibrium positions within the member, thereby resulting in the member having an atomic structure that has less strain within it. It is possible that such a "strain relaxed" member is more stable than a member in which is present substantial amounts of strain.

The substrate can be annealed via any known method, including but not limited to, direct heating, radiative heating, radio frequency (RF) heating, Joule dissipation due to passage of an electric current, and combinations thereof. It is likely that the choice of heating method is affected by the particular choice of materials constituting the substrate, the annealing temperatures required, the annealing protocol that needs to be followed, the proximity of any other parts which may or may not be capable of withstanding application of heat, amongst other factors.

The embodiments of the method 100 discussed herein are directed towards fabricating LWF components wherein a post-process effective work function is less than the pre-process work function. The post-process effective work function of the member that is achievable via one embodiment of the method 100, is less than about 2 eV.

In one embodiment of the method 100, the work function of the member, as a result of performing the above steps, is reduced. One possible mechanism responsible for work function reduction, in addition to that caused simply due to the increased concentration of a material (via an earlier, for example, ion implantation step) with an intrinsically low work function, is the formation of a new LWF compound ("agent") within the substrate. For example, when tungsten is disposed within a silicon carbide substrate, it is likely that some tungsten carbide, having a work function lower than tungsten and silicon carbide, is formed. Another possible mechanism is the formation of surface dipoles. For example, as discussed earlier, such surface dipoles are formed when cesium is disposed within a silicon substrate.

Suitable non-limiting examples of LWF components that can be fabricated via the embodiments of the method 100 disclosed herein include, an electrode, a solid state refrigerator, a MEMS switch, a solid state power generator, an electron emission device. LWF components are well known in the art (see for instance, Son et al., US Patent Application No. 20070257605, and Edelson et al. U.S. Pat. No. 6,103,298 as non-limiting examples).

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A method comprising:
   providing a member having an effective work function of an initial value;
   disposing a sacrificial layer on a surface of the member;
   disposing a first agent through the sacrificial layer and within the member to obtain a predetermined concentration of the agent at said surface of the member, wherein the first agent is disposed using an ion implantation technique;

subsequent to said disposing a first agent through the sacrificial layer, annealing the member; and subsequent to said annealing the member, removing the sacrificial layer to expose said surface of the member, wherein said surface has a post-process effective work function that is different from the initial value.

2. The method of claim 1, wherein said disposing a sacrificial layer includes disposing a sacrificial layer comprising a material selected from the group consisting of oxides, nitrides, carbides and polymers.

3. The method of claim 1, wherein the sacrificial layer comprises a material selected from the group consisting of silicon dioxide, silicon carbide, silicon nitride, polysilicon, and photoresists.

4. The method of claim 1, wherein said disposing a sacrificial layer includes disposing a sacrificial layer that has a thickness within the range from about 10 nm to about 500 nm.

5. The method of claim 1, wherein said disposing a sacrificial layer includes disposing a sacrificial layer that has a thickness within the range from about 500 nm to about 1000 nm.

6. The method of claim 1, wherein said disposing a sacrificial layer includes disposing a sacrificial layer that has a thickness within the range from about 1000 nm to about 5000 nm.

7. The method of claim 1, wherein the first agent is disposed within the member so that a concentration of the first agent at said surface is about 90%.

8. The component formed by the method of claim 1, wherein the component is a Solid State Refrigerator, a MEMS switch, a solid state power generation device, or an electron emission device.

9. The method of claim 1, wherein a post-process effective work function is less than about 2 eV.

10. The method of claim 1, wherein a post-process effective work function is less than the initial value.

11. The method of claim 1, wherein said providing a member includes providing a member comprising a semiconductor, a metal, an insulator, or combinations thereof.

12. The method of claim 11, wherein said providing a member includes providing a member comprising a semiconductor comprising a material selected from the group consisting of silicon, germanium, gallium nitride, silicon carbide, gallium arsenide, and indium nitride.

13. The method of claim 11, wherein said providing a member includes providing a member comprising a metal comprising a material selected from the group consisting of aluminum, copper, silver, and gold.

14. The method of claim 11, wherein said providing a member includes providing a member comprising an insulator comprising a material selected from the group consisting of glass, quartz, and sapphire.

15. The method of claim 1, further comprising forming of dipoles within the member.

16. The method of claim 15, wherein the said forming of dipoles is achieved via an oxygen treatment of the member, wherein the oxygen treatment results in a diffusion of oxygen into the member.

17. The method of claim 1, wherein said providing a member includes providing an electrode.

18. The method of claim 1, wherein said disposing a first agent within the member includes disposing a first agent comprising a material selected from the group consisting of carbon, tungsten, tungsten carbide, cesium, sodium, potassium, strontium, and rubidium.

19. The method of claim 1, further comprising disposing a second agent at said surface.

20. The method of claim 19, wherein the second agent is disposed via diffusion.

21. The method of claim 19, wherein said disposing a second agent at said surface include disposing a second agent so as to combine the second agent with the first agent.

22. The method of claim 19, wherein the annealing results in a combination of the first agent and the second agent to form another agent.

23. A method comprising:
providing a member having an effective work function of an initial value;
disposing a sacrificial layer on a surface of the member;
disposing a first agent through the sacrificial layer and within the member to obtain a predetermined concentration of the agent at said surface of the member, wherein the first agent is disposed using an ion implantation technique;
annealing the member; and
removing the sacrificial layer to expose said surface of the member, wherein said surface has a post-process effective work function that is different from the initial value and less than about 2 eV.

* * * * *